(12) United States Patent
Siegel et al.

(10) Patent No.: US 9,362,519 B2
(45) Date of Patent: Jun. 7, 2016

(54) ELECTRO-OPTICAL COMPONENT HAVING A QUANTUM DOT STRUCTURE

(71) Applicant: ZUMTOBEL LIGHTING GMBH, Dornbirn (AT)

(72) Inventors: Martin Siegel, Bodolz (DE); Verena Eckbauer, Tutzing (DE)

(73) Assignee: ZUMTOBEL LIGHTING GMBH, Dornbirn (AT)

( * ) Notice: Subject to any disclaimer, the term of this patent is extended or adjusted under 35 U.S.C. 154(b) by 0 days.

(21) Appl. No.: 14/426,238

(22) PCT Filed: Sep. 6, 2013

(86) PCT No.: PCT/EP2013/068436
§ 371 (c)(1),
(2) Date: Mar. 5, 2015

(87) PCT Pub. No.: WO2014/037484
PCT Pub. Date: Mar. 13, 2014

(65) Prior Publication Data
US 2015/0236289 A1   Aug. 20, 2015

(30) Foreign Application Priority Data

Sep. 6, 2012   (DE) .......................... 10 2012 215 792

(51) Int. Cl.
*H01L 33/00* (2010.01)
*H01L 51/50* (2006.01)
(Continued)

(52) U.S. Cl.
CPC ................ *H01L 51/502* (2013.01); *F21V 9/16* (2013.01); *H01L 51/506* (2013.01);
(Continued)

(58) Field of Classification Search
CPC ..... H01L 25/048; H01L 27/288; H01L 27/32; H01L 28/26
USPC ................................................. 257/13, 98, 99
See application file for complete search history.

(56) References Cited

U.S. PATENT DOCUMENTS 8,003,008 B1   8/2011   Huebner et al.
8,866,001 B1 * 10/2014   Ziegler ................ H01L 31/0525
                                                             136/247
(Continued)

FOREIGN PATENT DOCUMENTS

WO   2011041407   4/2011
WO   2011156519   12/2011
(Continued)

OTHER PUBLICATIONS

International Search Report for PCT/EP2013/068436, English translation attached to original, Both completed by the European Patent Office on Oct. 28, 2013, All together 8 Pages.
(Continued)

*Primary Examiner* — Tan N Tran
(74) *Attorney, Agent, or Firm* — Brooks Kushman P.C.

(57) ABSTRACT

Two-photon polymerization is used to embed a quantum dot structure in an electro-optical component. The electro-optical component can be a polymer component, LED, OLED, LEC, or graphene component, for example. The efficiency and characteristics of the components are improved or influenced. The quantum dot structure can emit light, convert light from other layers of the component, or influence the conductivity in the component, for example. A method of producing an electro optical fractal antenna by two-photon polymerization is also disclosed.

12 Claims, 5 Drawing Sheets

(51) Int. Cl.
*F21V 9/16* (2006.01)
*H01L 51/56* (2006.01)
*F21Y 105/00* (2016.01)

(52) U.S. Cl.
CPC ....... *H01L 51/5032* (2013.01); *H01L 51/5076* (2013.01); *H01L 51/56* (2013.01); *F21Y 2105/008* (2013.01); *H01L 2251/5369* (2013.01)

(56) References Cited

U.S. PATENT DOCUMENTS

| | | | | |
|---|---|---|---|---|
| 9,030,108 | B2* | 5/2015 | Deak, Sr. | H05B 33/0803 257/17 |
| 2008/0020235 | A1* | 1/2008 | Parce | B82Y 20/00 428/690 |
| 2008/0309234 | A1* | 12/2008 | Cho | H05B 33/22 313/509 |
| 2010/0117110 | A1 | 5/2010 | Park et al. | |
| 2011/0095261 | A1* | 4/2011 | Kazlas | B82Y 20/00 257/13 |
| 2012/0001217 | A1* | 1/2012 | Kang | C08G 75/045 257/98 |
| 2012/0068154 | A1* | 3/2012 | Hwang | H01L 51/502 257/13 |
| 2012/0168815 | A1 | 7/2012 | Koh et al. | |
| 2013/0048943 | A1* | 2/2013 | Lee | H01L 51/5215 257/13 |

FOREIGN PATENT DOCUMENTS

| | | |
|---|---|---|
| WO | 2012013270 | 2/2012 |
| WO | 2012110178 | 8/2012 |

OTHER PUBLICATIONS

Xia et al. Applied Physics Letters 2009, vol. 95, No. 8, 4 Pages, "Three-dimensional micronanofabrication via two-photon-excited photoisomerization."
Jia et al. Advanced Materials 2010, vol. 22, p. 2463-2467, "Highly Non-Linear Quantum Dot Doped Nanocomposites for Functional Three-Dimensional Structures Generated by Two-Photon Polymerization."

* cited by examiner

ELECTRO-OPTICAL COMPONENT HAVING A QUANTUM DOT STRUCTURE

CROSS-REFERENCE TO RELATED APPLICATIONS

This application is the U.S. national phase of PCT Application No. PCT/EP2013/068436 filed on Sep. 6, 2013, which claims priority to DE Patent Application No. 10 2012 215 792.1 filed on Sep. 6, 2012, the disclosures of which are incorporated in their entirety by reference herein.

TECHNICAL FIELD

The present invention relates to an electro-optical component comprising a polymer layer, into which a quantum dot structure is embedded.

BACKGROUND

The present invention is based on the use of so-called quantum dot structures to increase or adapt the efficiency of electro-optical components. The dimensions of an individual quantum dot are typically in the nanometers range in all three spatial dimensions. A quantum dot, on account of these very small dimensions, has material properties that are dependent on its size. In particular, in a quantum dot quantum effects can occur for charges on account of the spatially very great localization thereof. By way of example, discrete energy levels for charges form in the quantum dot and can be used to influence specific properties of electro-optical components in a targeted manner.

Quantum dots are already known from the prior art; however, said quantum dots can be arranged in controlled 3D structures only with very great difficulty and, in particular, it is only with very great difficulty that said quantum dots can be formed and dimensioned in large numbers in a controlled way and at the same time can be arranged in a controlled manner.

In particular, so-called colloidal quantum dots are known, which are produced in a liquid phase. The colloidal quantum dots allow very precise size growth and thus very accurate setting of a band gap, i.e. also of an emission wavelength. However, colloidal quantum dots practically cannot be arranged spatially at all. One or more reasonably ordered, densely deposited layers of quantum dots can be achieved at best.

Furthermore, so-called epitaxial quantum dots are known, which are grown by molecular beam epitaxy on a surface. The epitaxial quantum dots can be grown in a targeted manner, i.e. it is possible to produce some specific 3D structures by, for example, microstructuring of the surface. However, the influence on the size of the quantum dots and thus an emission wavelength is very low.

SUMMARY

The use of so-called two-photon polymerization now makes it possible for the first time to produce structures having extremely small dimensions directly and primarily in a supervisable and accurately controllable manner. By means of corresponding two-photon lithography which makes use of the effect of two-photon polymerization, it is possible to form three-dimensional structures having dimensions corresponding to those of quantum dots.

The present invention addresses the problem of increasing or adapting the efficiency of known electro-optical components. For this purpose, the present invention proposes integrating a quantum dot structure consisting of a multiplicity of quantum dots into a component. In particular, the abovementioned problem can be solved by means of an electro-optical component as claimed in the accompanying claims. The independent claim describes the central concept of the invention. The dependent claims advantageously develop said central concept.

The present invention relates to an electro-optical component comprising a polymer layer, into which a quantum dot structure is embedded, wherein the quantum dot structure is a section of the polymer layer, said section being structured by two-photon polymerization. In particular, the quantum dot structure is produced by two-photon polymerization. To put it more precisely, the quantum dot structure is a section of the polymer layer, said section being structured by means of two-photon polymerization.

The quantum dot structure can be designed in such a way that it itself as a whole produces a quantum effect. By way of example, by means of the size of the quantum dots and the distance between the individual quantum dots, a band gap can be produced in the quantum dot structure. That means that there are collective discrete energy levels for charges in the quantum dot structure. The quantum dot structure can also itself act as a quantum dot. The quantum dot structure can influence the properties of the polymer layer (the polymer layer can also be a polymer block) in a targeted manner. By way of example, if a polymer layer having light emitting properties is involved, then the quantum dot structure can influence the light emission (for example by means of its band gap) and for example alter the wavelength of the emitted light. The quantum dot structure can also form a fractal antenna. With the aid of such a structure, light can be received and emitted in a targeted manner. The quantum dot structure can also form an optical antenna.

In a first embodiment, the electro-optical component is an organic light emitting diode comprising at least one organic layer for emitting light.

The organic light emitting diode can emit light from an arbitrary wavelength range, i.e. of arbitrary color.

Advantageously, the polymer layer with the embedded quantum dot structure adjoins the at least one organic layer. A best possible coupling and the greatest effect are achieved as a result.

Advantageously, the quantum dot structure is designed to alter the wavelength range, preferably a blue wavelength range, of at least part of the light emitted by the at least one organic layer.

The component is preferably provided with an organic layer for emitting light from the blue wavelength range. The quantum dot structure then acts similarly to a luminophore that is known for light emitting diodes. Mixed light, for example white light, can thus be generated. The quantum dot structure can emit yellow light for example in addition to the blue light of the organic layer. The overall impression then produces white light.

Advantageously, the quantum dot structure is designed to alter an electron conductivity in an electron transport layer and/or a hole conductivity in a hole transport layer of the component.

A high efficiency of organic light emitting diodes (OLED) can be achieved only if the corresponding transport layers have suitable properties, in particular a high conductivity. By virtue of the quantum dot structure being introduced, said conductivity can be improved in order in turn to improve the efficiency of the OLED.

Advantageously, the quantum dot structure is arranged between at least two organic layers, wherein the quantum dot structure is designed to alter a band gap between the layers of the component.

In this way, it is possible to influence the conductivity between the different layers in a targeted manner, since said conductivity is dependent on the band profile in the component.

Advantageously, the quantum dot structure is designed for direct light emission.

The total light emission of the OLED can thus be amplified. The efficiency can be improved.

In a second embodiment, the electro-optical component is a liquid electrochemical cell, wherein the polymer layer contains an electrolyte and is designed for emitting light, preferably from a blue wavelength range.

Advantageously, the quantum dot structure is designed to alter the wavelength range of at least part of the light emitted by the polymer layer.

The quantum dot structure once again acts like a luminophore and can be used to generate white light.

Advantageously, the quantum dot structure is designed for direct light emission.

The total light emission of the liquid electrochemical cell (LEC) can thus be amplified. The efficiency can be improved.

In a third embodiment, the electro-optical component comprises at least one graphene layer, wherein the polymer layer with the embedded quantum dot structure is applied to the at least one graphene layer.

The band gap in or the conductivity of a graphene layer can be altered by structures or materials being applied to the surface of the graphene layer. The result can be significantly improved by a quantum dot structure being applied, since a targeted arrangement of very specifically coordinated quantum dot structures is possible.

Advantageously, the polymer layer with the embedded quantum dot structure is arranged between two graphene layers.

This enables the band gap of the graphene layer to be doubly influenced. Firstly by the quantum dot structure on the surface of the graphene layers. Secondly by the distance between the two graphene layers, that is to say by the thickness of the polymer layer. The effect can thus be amplified and set in a targeted manner.

The present invention furthermore relates to a method for producing an electro-optical component comprising producing a quantum dot structure composed of quantum dots in a polymer layer by structuring at least one section of the polymer layer by two-photon polymerization.

In one embodiment, the method is designed for producing optical antennas, preferably fractal antennas, as the electro-optical component.

By structuring sections of the polymer layer in such a way that a quantum dot structure arises, it is possible for the first time to embed quantum dots into known components in a supervised and controllable manner. As a result, the efficiency of the electro-optical components can be increased or the mode of operation of the electro-optical components can be influenced in a targeted manner.

BRIEF DESCRIPTION OF THE DRAWINGS

The present invention is described below with reference to the accompanying figures.

DETAILED DESCRIPTION

Figure 1:
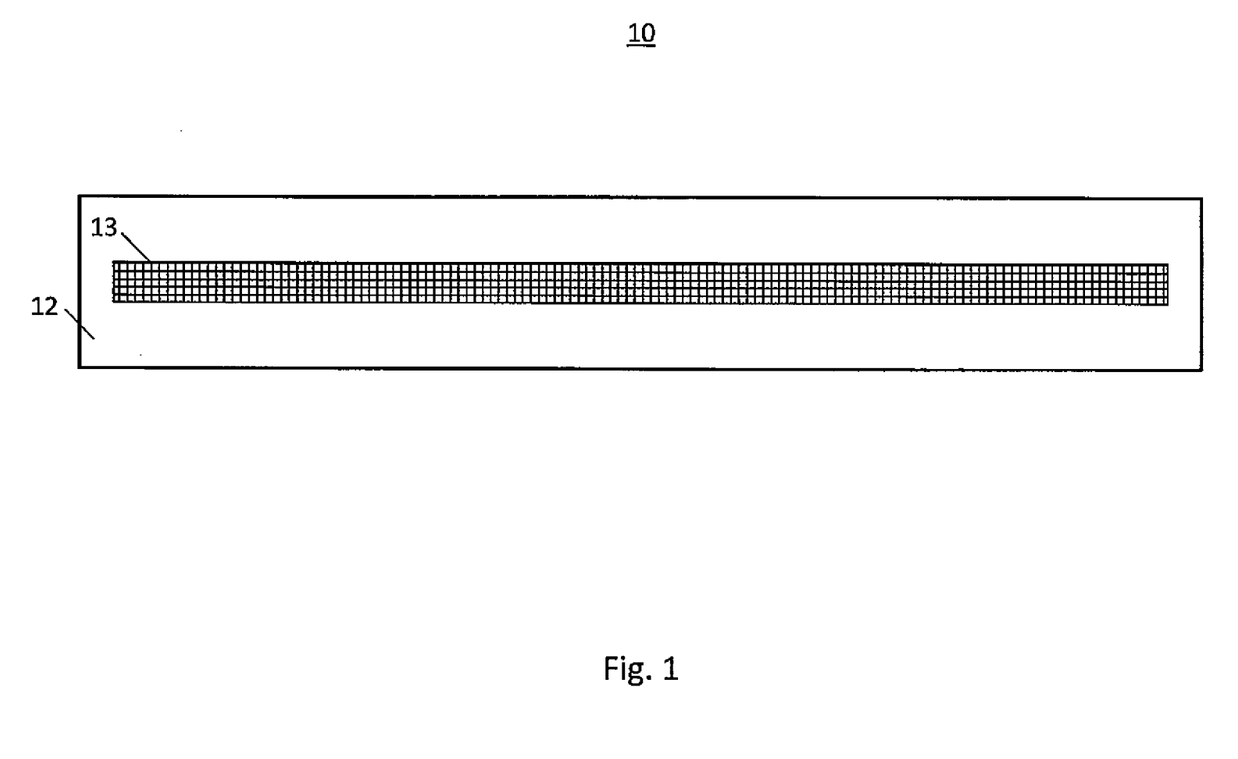
FIG. 1 shows an electro-optical component comprising a polymer layer according to the present invention.

FIG. 1 shows an electro-optical component 10, in which a polymer layer 12 (or a polymer block) is provided with an embedded quantum dot structure 13 composed of a multiplicity of quantum dots. Each quantum dot of the quantum dot structure 13 is fashioned and dimensioned in such a way that discrete, i.e. quantized, energy levels formed for electrical charges (e.g. electrons or holes) in the quantum dot. The entire quantum dot structure is preferably fashioned and dimensioned in such a way that quantum effects also arise for the entire quantum dot structure. By way of example, a band gap can form in the quantum dot structure 13 on account of the quantum mechanical coupling of a multiplicity of quantum dots. For this purpose, the individual quantum dots must have an order of magnitude of less than 25 nm and should be arranged as periodically as possible and as close together as possible. Each quantum dot acts individually like an artificial atom; the entire quantum dot structure can simulate the properties of a semiconductor crystal, for instance.

The properties of the entire polymer layer 12 can thereby be influenced in a targeted manner by the introduced quantum dot structure 13. Since the quantum dot structure 13 itself brings about quantum effects (for example produces a band gap), an electro-optical component 10 suitable for light emission (for instance by means of charge relaxation via the band gap of the quantum dot structure 13) can be produced, for example. If the polymer layer 12 is already suitable for light emission (for example on account of an inherent band gap in the polymer layer), then the quantum dot structure 13 (for example by altering the band gap of the polymer) can influence the wavelength of the light emitted from the polymer layer 12. By way of example, the wavelength of the light can be altered.

The polymer layer 12 with embedded quantum dot structure 13 can be produced by a method in which at least one section of the polymer layer 10 is structured by means of two-photon polymerization. The quantum dot structure 13 can be designed and dimensioned by means of two-photon lithography that makes use of the effect of two-photon polymerization such that quantum effects are brought about in the structure as a whole. In this case, the quantum effects can be brought about even without the embedding of further quantum dots. In this case, the smallest elements of the quantum dot structure 13 already act as quantum dots by themselves.

Figure 2:
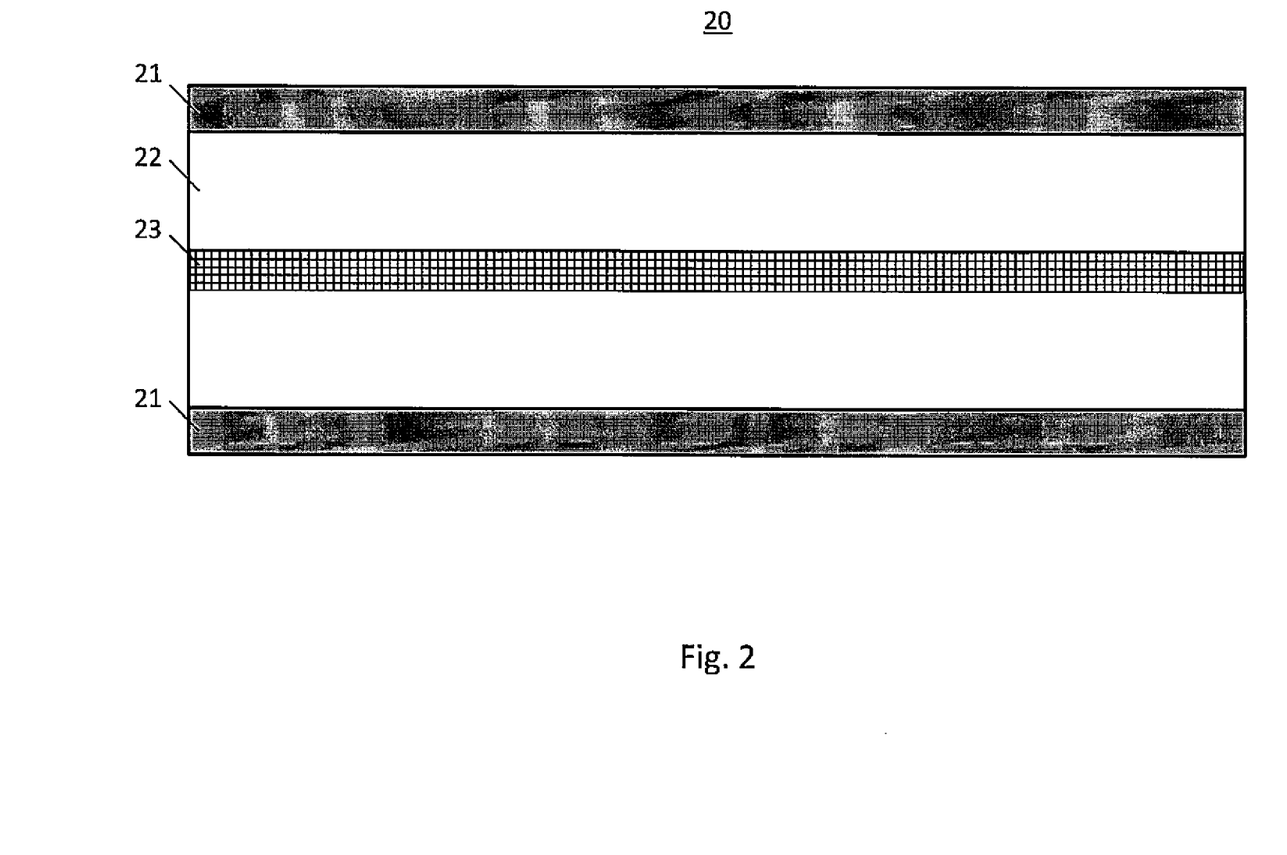
FIG. 2 shows a liquid electrochemical cell of the present invention.

FIG. 2 shows a further possibility for using the quantum dot structure 23. FIG. 2 shows, in particular, a liquid electrochemical cell 20 (LEC). The liquid electrochemical cell 20 consists of a polymer layer 22, on the two surfaces of which electrodes 21 are applied. The polymer layer 22 is preferably produced from an emitter material (material suitable for light emission), for example a material that is also used for organic light emitting diodes (OLEDs). Suitable materials are, for example, polymers or "small molecule" polymers.

The polymer layer 22 also contains an electrolyte. When a voltage is applied to the electrodes 21, a p-n junction forms in the polymer layer 22 as a result of the migration of the electrolyte to the electrodes 21. The polymer layer 22 is therefore suitable for light emission with an applied voltage (the p-n junction is used for light emission as in a conventional light emitting diode).

A quantum dot structure 23 is additionally embedded into the polymer layer 22. The quantum dot structure 23 is three-dimensional and written into the polymer layer 22 by means of two-photon polymerization. The two-photon polymerization is preferably carried out by means of a femtosecond laser (e.g. Ti-sapphire laser) that is focused onto the polymer layer 22. A chemical reaction takes place only in the focal region of the laser, that is to say in a greatly localized manner, said chemical reaction leading to a polymerization of the polymer layer 22 in the focal region. Unpolymerized parts of the material of the polymer layer 22 can be washed away. A three-dimensional structure with a resolution of up to 25 nanometers can arise as a result. By means of the two-photon polymerization, it is possible to accurately define the location and the form of the quantum dot structure 23 within the polymer layer 22 of the electro-optical component 20.

Preferably, the polymer layer 22 is designed for emitting light from the blue wavelength range. One application possibility is to structure the quantum dot structure 23 (that is to say to choose the dimensions and forms of the individual quantum dots and also the dimensions and form of the entire quantum dot structure 23) such that the quantum dot structure 23 can alter the wavelength range of the light emitted by the polymer layer 22. As a second application possibility, the quantum dot structure 23 can also itself be designed for light emission in order to improve the efficiency of the light emitted in total by the component 20.

In the case of the first application possibility, the quantum dot structure 22 converts at least part of the light emitted by the polymer layer 22. By way of example, blue light emitted by the polymer layer 22 can be partly converted into yellow light. Overall, a white-luminous electro-optical component 20 can arise as a result. In this case, the quantum dot structure 23 acts similarly to a luminophore (e.g. phosphor) such as is known from the LED field.

In the case of the second application possibility, a suitable three-dimensional quantum dot structure 23 is produced and fashioned in such a way that the individual quantum dots couple to one another such that a band gap suitable for light emission arises in the entire quantum dot structure 23. By means of said band gap, the quantum dot structure 23 itself can emit light if a voltage is present at the electrodes 21. The efficiency of the component 20 can be improved as a result.

Figure 3:
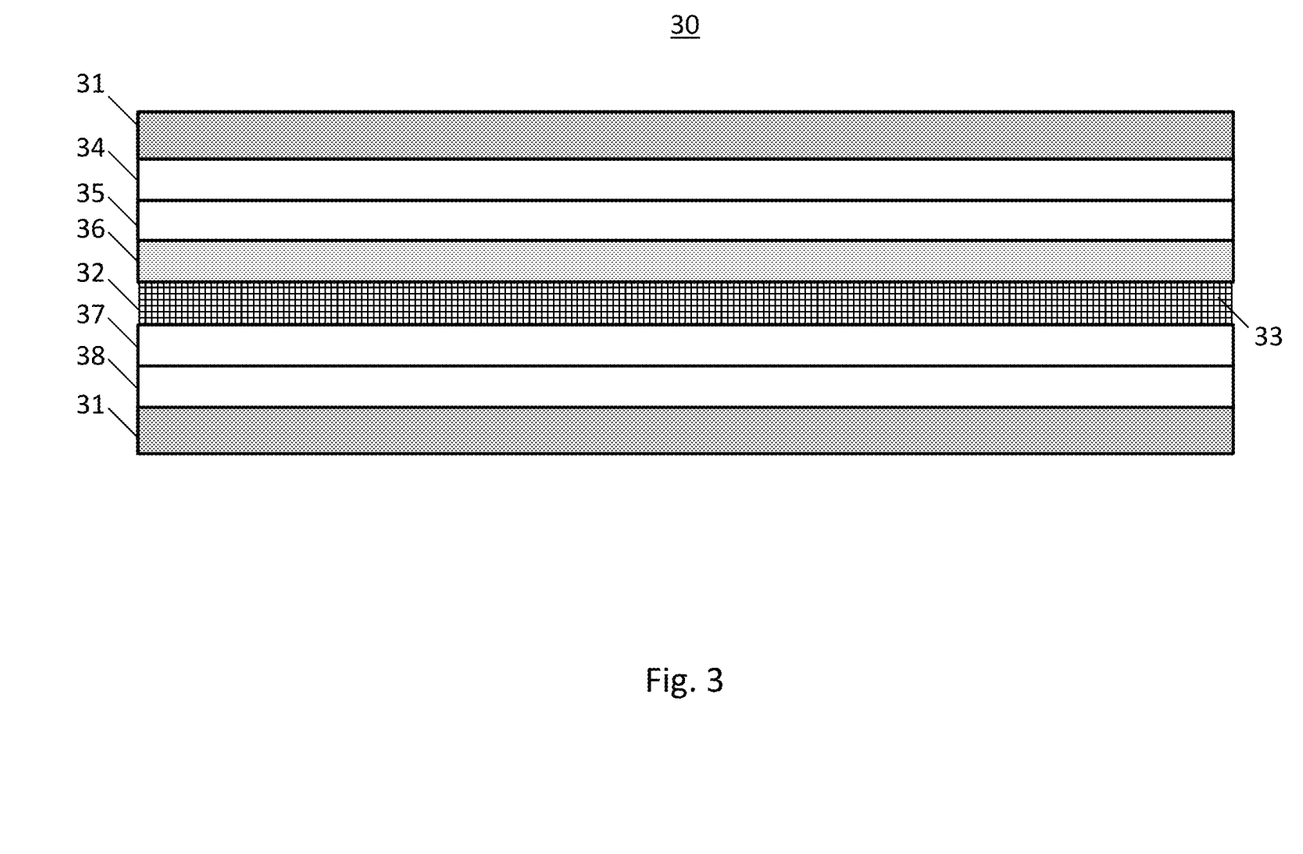
FIG. 3 shows a first organic light emitting diode of the present invention.

FIG. 3 shows a further embodiment of an electro-optical component 30 of the present invention. In particular, the component 30 is an OLED. The OLED consists of a bottom electrode 31, to which a hole injection layer 38 and a hole transport layer 37 are applied. The OLED 30 furthermore consists of a polymer layer 32, which is applied on the hole transport layer 37, into which a quantum dot structure 33 is embedded. An emission layer 36, preferably an organic layer 36, is suitable for light emission. The organic layer 36 is preferably applied to the quantum dot structure 33 in an adjoining fashion. Furthermore, there is applied to the organic layer 36 an electron transport layer 35, an electron injection layer 34 and finally a further electrode 31. A p n junction forms in the emission layer of the OLED 30 and the OLED 30 can emit light when a voltage is applied to the electrodes 31.

Preferably, the OLED 30 of the present invention is an OLED which emits light in the blue wavelength range. However, OLEDs of arbitrary color can be used. The OLED 30 with written quantum dot structure 33 can have various improvements with respect to conventional OLEDs.

Firstly, the quantum dot structure 33 can be designed to alter the wavelength range and at least part of the light emitted by the organic layer 36. In this case, the light to be altered is preferably from the blue wavelength range. In this case, the quantum dot structure 33 is once again dimensioned and fashioned such that it takes up part of the light from the organic layer 36 and emits it in a different wavelength. As a result, the wavelength of at least part of the preferably blue light of the organic layer 36 is converted. The quantum dot structure 33 thus acts like a luminophore (phosphor). White light, for example, can once again be generated by an emission of yellow light from the quantum dot structure 33 in addition to blue light from the organic layer 36.

By arranging the quantum dot structure 33 in proximity to or in a manner adjoining the organic emission layer 36, however, it is also possible to increase the efficiency of the organic layer 36 itself by means of the quantum dot structure 33 being fashioned such that it increases the efficiency of the OLED 30 by means of its own light emission.

A further possibility is to dimension and fashion the quantum dot structure 33 such that the conductivity for holes and/or for electrons in the electron transport layer and/or the hole transport layer is influenced. This increases the efficiency of the OLED 30, since the conductivity properties of the two transport layers mentioned crucially determine the efficiency of the OLED 30.

Figure 4:
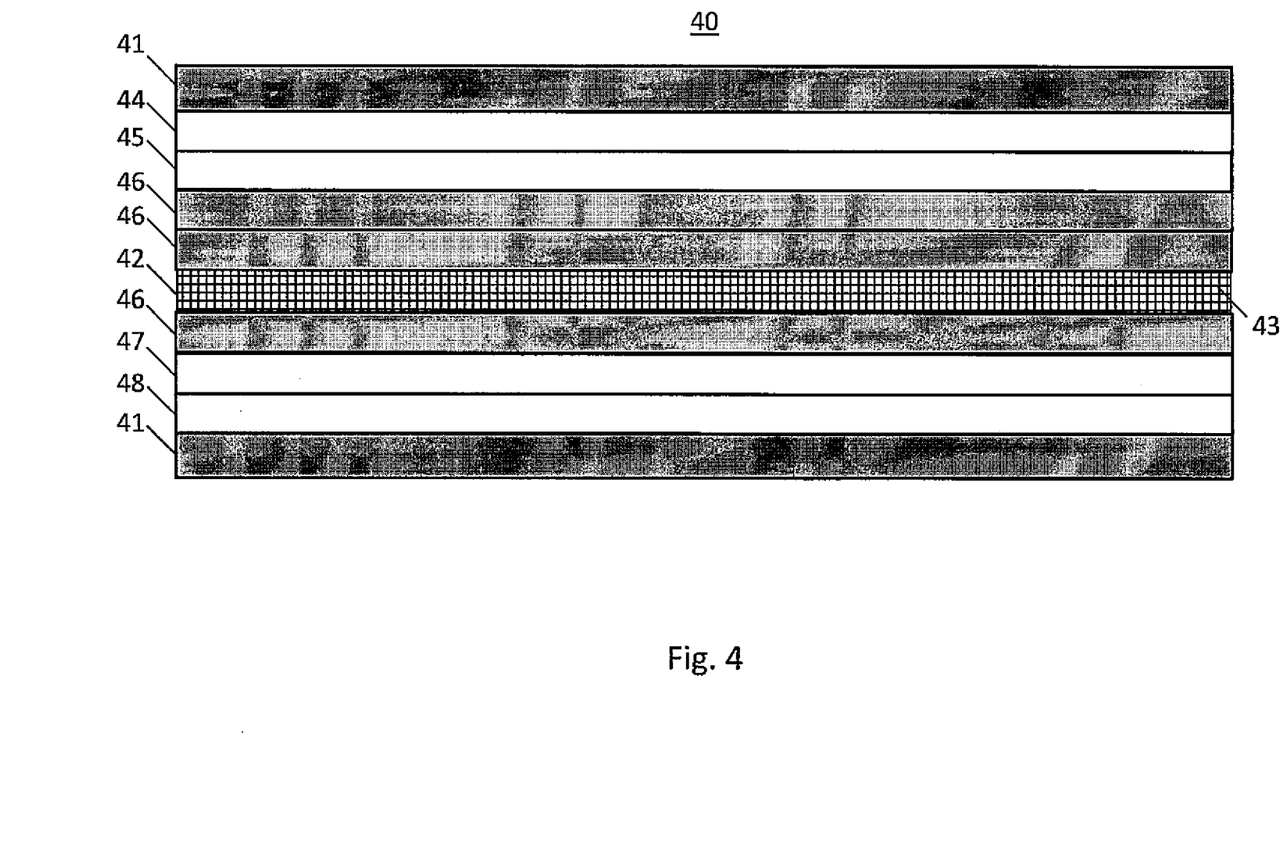
FIG. 4 shows a second organic light emitting diode of the present invention.

FIG. 4 shows a particularly efficient embodiment of an OLED 40. The OLED 40 differs from the OLED 30 from FIG. 3 in that it has three organic layers 46 instead of one. The quantum dot structure 43 is embedded between two of the three organic layers 46. Similar to the OLED 30 from FIG. 3, the OLED 40 in FIG. 4 also comprises two electrodes 41, an electron injection layer 44, an electron transport layer 45, a hole transport layer 47 and a hole injection layer 48 and further a quantum dot structure 43. The quantum dot structure 43 is further designed such that it influences the conductivity between the different layers in a targeted manner. This can be achieved by virtue of the quantum dot structure 43 influencing the band gap of the emission layer 36. Said band gap can be influenced by virtue of the fact that the quantum dot structure 43 itself forms a band gap given suitable dimensioning, typically in the case 5 of structures with quantum dots smaller than 25 nm.

FIGS. 5a and 5b relate to a further possibility of using quantum dot structures 53 and 63, respectively, for influencing an electro-optical component 50, 60 in a targeted manner. The component 50 comprises a graphene layer 59, on which a polymer layer 52 with embedded quantum dot structure 53 is applied. Graphene is a material which consists of hexagonal carbon structures and has a high conductivity. One typical problem of such a graphene material is that the conductivity or the production and/or setting of a band gap is very difficult and only possible to a limited extent, since the material inherently has no band gap. Conventional approaches here attempt to provide the surface of graphene with further structures. However, no possibility of controlling the targeted arrangement of such structures has been afforded hitherto.

Figure 5:
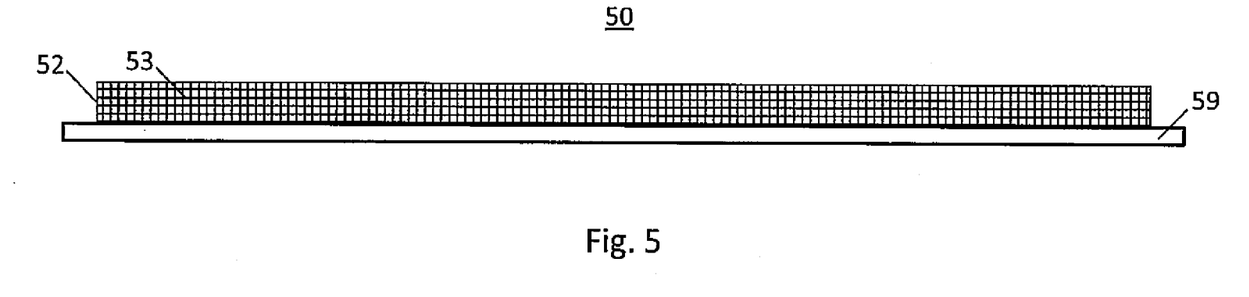
FIG. 5 shows an electro-optical component comprising one graphene layer according to the present invention.
Figure 6:
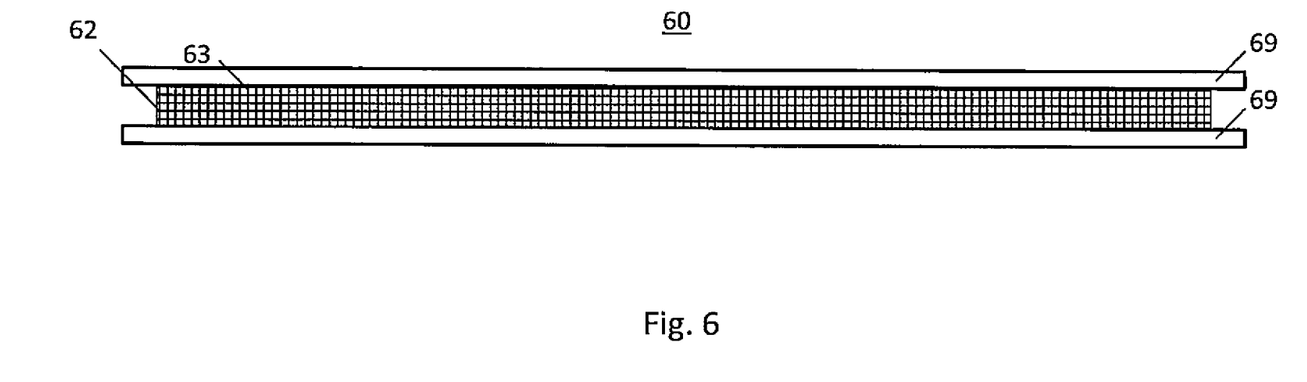
FIG. 6 shows an electro-optical component comprising two graphene layers according to the present invention.

As a result of the targeted arrangement of the quantum dot structure 53 on the graphene at the band gap of the graphene 59 be altered to a desired extent given corresponding dimensioning of the quantum dot structure 53. In particular, as in FIG. 6, it is possible to produce a sandwich structure composed of two adjacent graphene layers 69, between which a polymer layer 62 with embedded quantum dot structure 53 is introduced. The setting of the band gap of the graphene can then be set both by the quantum dot structure 53 and by the distance between the two graphene layers 69. The dimensioning of the quantum dot structure 63 thus doubly influences the band gap of the graphene material.

The present invention also encompasses the production of quantum dot structures in the form of so-called fractal antennas. Corresponding components comprising fractal antenna structures are therefore also encompassed by the invention. Such fractal antennas are structures in a size range which makes it possible to receive and/or to emit light in a targeted manner (analogously to an antenna for radio signals). Such structures can capture light from a very large surrounding area and concentrate and emit it in a targeted manner in a specific direction.

Overall, two-photon polymerization, or two-photon lithography that uses the abovementioned effect, makes it possible to integrate quantum dot structures into known electro-optical components such as e.g. polymer components, LEDs, OLEDs, LECs or graphene components. The efficiency and characteristics of the components are improved or influenced in this case.

The invention claimed is:

1. An electro-optical component comprising:
a polymer layer, into which a quantum dot structure is embedded, wherein the quantum dot structure is a section of the polymer layer, said section being structured by two-photon polymerization to form a plurality of specifically located small uniformly sized 3-dimensional quantum dots and wherein the polymer layer with the embedded quantum dot structure adjoins at least one organic layer;
wherein the quantum dot structure:
is designed to alter an electron conductivity in an electron transport layer and/or a hole conductivity in a hole transport layer of the component;
is arranged between at least two organic layers, and defines a band gap between the layers of the component.

2. The electro-optical component as claimed in claim 1, wherein the component is an organic light emitting diode comprising the at least one organic layer for emitting light.

3. The electro-optical component as claimed in claim 2, wherein the quantum dot structure is designed to alter a blue wavelength range of at least part of the light emitted by the at least one organic layer.

4. The electro-optical component as claimed in claim 2, wherein the quantum dot structure causes direct light emission.

5. The electro-optical component as claimed in claim 1, wherein the embedded quantum dots are smaller than 25 nm.

6. The electro-optical component as claimed in claim 1, wherein the component is a liquid electrochemical cell; and
the polymer layer contains an electrolyte and is designed for emitting light from a blue wavelength range.

7. The electro-optical component as claimed in claim 6, wherein the quantum dot structure is designed to alter the wavelength range of at least part of the light emitted by the polymer layer.

8. The electro-optical component as claimed in claim 6, wherein the quantum dot structure is designed for direct light emission.

9. An electro-optical component comprising:
a polymer layer, into which a quantum dot structure is embedded, wherein the quantum dot structure is a section of the polymer layer, said section being structured by two-photon polymerization; and wherein the polymer layer with the embedded quantum dot structure adjoins at least one organic layer; and
at least one graphene layer;
wherein the polymer layer with the embedded quantum dot structure is applied to the at least one graphene layer, and
wherein the quantum dot structure:
is designed to alter an electron conductivity in an electron transport layer and/or a hole conductivity in a hole transport layer of the component;
is arranged between at least two organic layers; and
defines a band gap between the layers of the component.

10. The electro-optical component as claimed in claim 9, wherein the polymer layer with the embedded quantum dot structure is arranged between two graphene layers.

11. A method for producing an electro-optical fractal antennas comprising;
producing a quantum dot structure composed of quantum dots in a polymer layer by structuring at least one section of the polymer layer by two-photon polymerization to form an electro-optical component; and
forming at least two organic layers;
wherein the quantum dot structure:
is designed to alter an electron conductivity in an electron transport layer and/or a hole conductivity in a hole transport layer of the component;
is arranged between the at least two organic layers; and
defines a band gap between the layers.

12. The method as claimed in claim 11 wherein the quantum dots produced are smaller than 25 nm.

* * * * *